(12) United States Patent
Summerson et al.

(10) Patent No.: US 8,839,085 B2
(45) Date of Patent: Sep. 16, 2014

(54) SYSTEMS AND METHODS FOR A SOFT-INPUT DECODER OF LINEAR NETWORK CODES

(75) Inventors: Samantha Rose Summerson, Houston, TX (US); Anuj Batra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 13/596,005

(22) Filed: Aug. 27, 2012

(65) Prior Publication Data

US 2013/0232397 A1    Sep. 5, 2013

Related U.S. Application Data

(60) Provisional application No. 61/527,958, filed on Aug. 26, 2011.

(51) Int. Cl.
*G06F 11/10* (2006.01)
*H03M 13/00* (2006.01)
*G06F 11/07* (2006.01)
*H04L 1/00* (2006.01)

(52) U.S. Cl.
CPC .......... *G06F 11/0751* (2013.01); *H03M 13/00* (2013.01); *H04L 1/00* (2013.01); *H04L 1/0076* (2013.01)
USPC .......................................... 714/807; 714/755

(58) Field of Classification Search
CPC ..................................................... H03M 13/00
USPC .................................. 714/755, 807; 370/276
See application file for complete search history.

(56) References Cited

U.S. PATENT DOCUMENTS

| | | | |
|---|---|---|---|
| 5,278,846 A * | 1/1994 | Okayama et al. | 714/755 |
| 2003/0093741 A1 * | 5/2003 | Argon et al. | 714/755 |
| 2012/0236763 A1 * | 9/2012 | Lucani et al. | 370/276 |

* cited by examiner

*Primary Examiner* — Sam Rizk
(74) *Attorney, Agent, or Firm* — Steven A. Shaw; Frederick J. Telecky, Jr.

(57) ABSTRACT

A method for decoding linear network codes that includes receiving a plurality of packets from an ererror detector and generating a matrix out of the plurality of packets where elements of each column of the matrix correspond to symbols of the plurality of packets. Then decoding across each row of the matrix using only the symbols with highest associated reliability values to obtain a decoded matrix, where each column of the decoded matrix corresponds to a message packet.

20 Claims, 3 Drawing Sheets

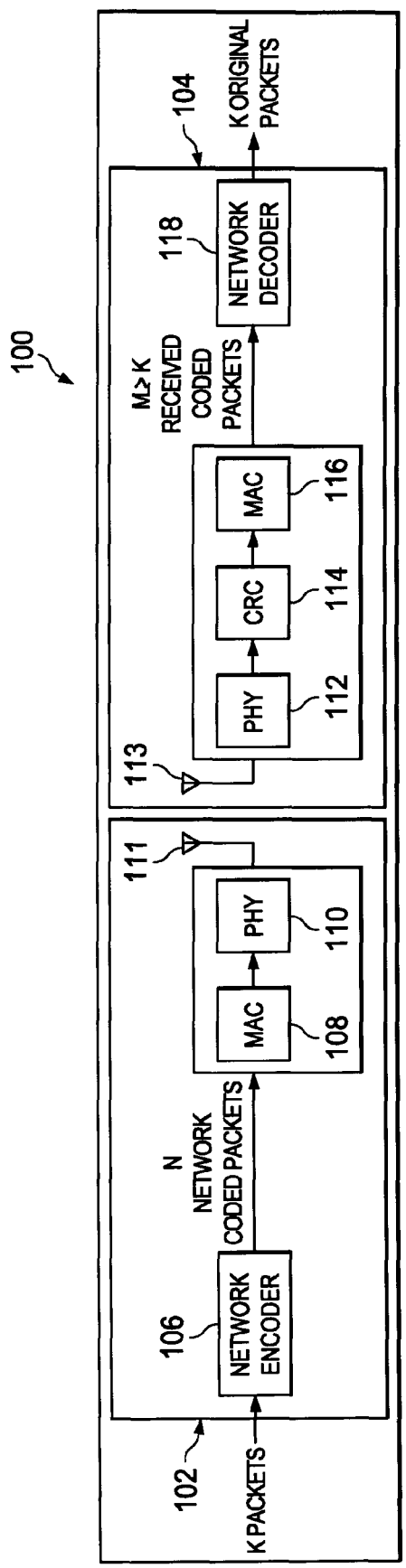
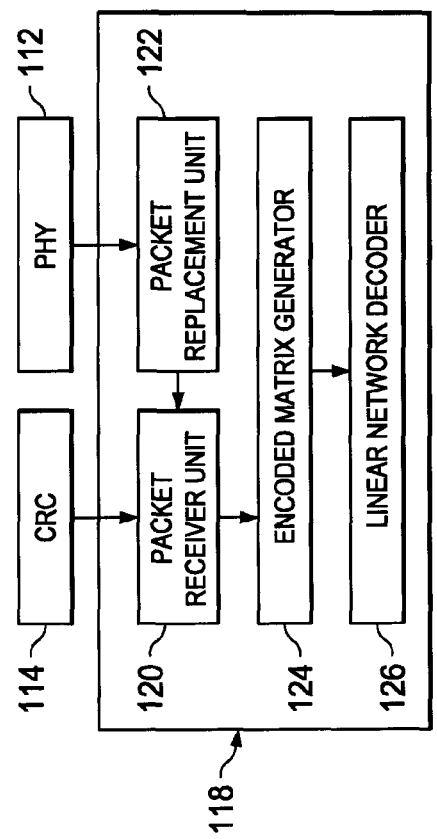
FIG. 1a
FIG. 1b

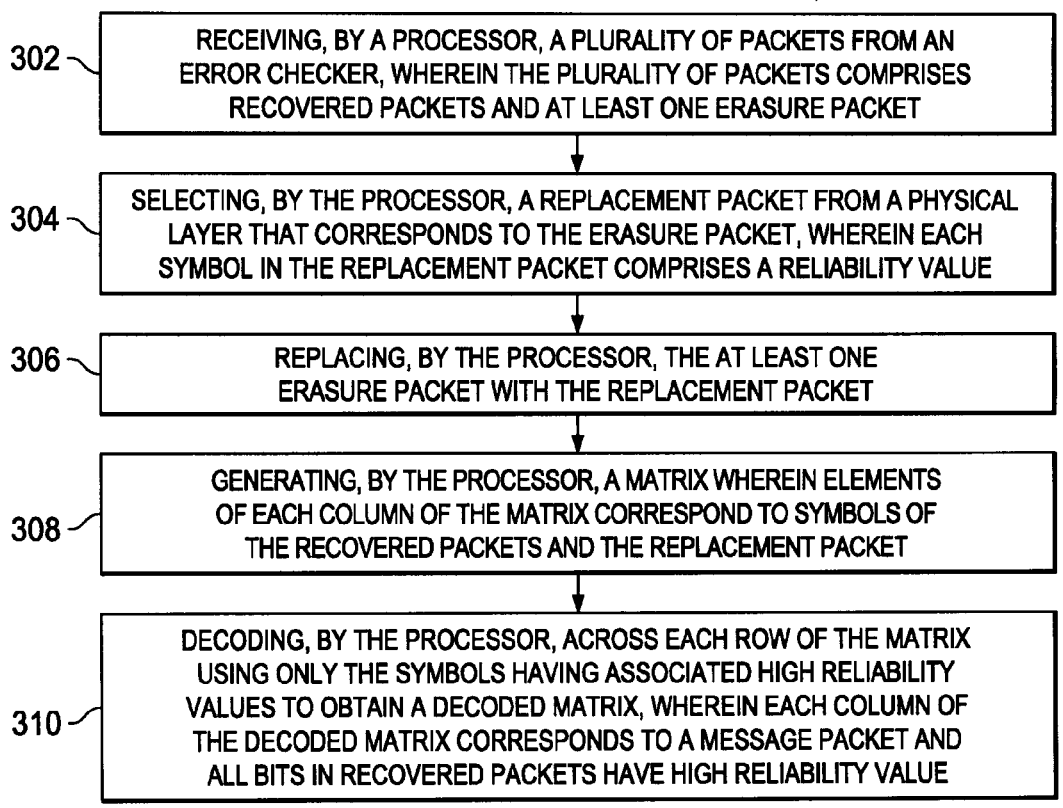
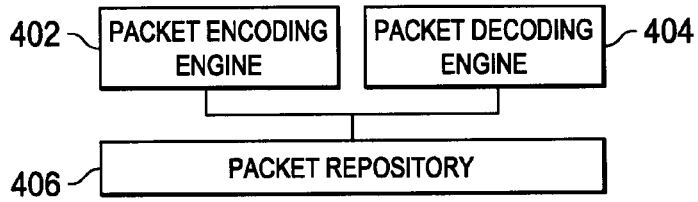
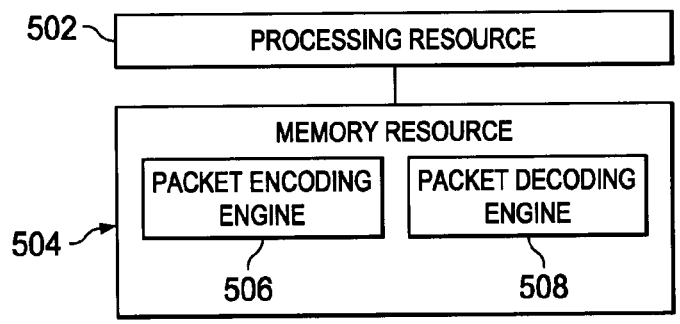

SYSTEMS AND METHODS FOR A SOFT-INPUT DECODER OF LINEAR NETWORK CODES

CROSS-REFERENCE TO RELATED APPLICATION

The present application claims priority to U.S. Provisional Patent Application No. 61/527,958 filed on Aug. 26, 2011 ; which is hereby incorporated herein by reference. Additionally, the present application may be related to co-pending U.S. patent application Ser. Nos. 13/595,774, 13/595,862, 13/595,894, and 13/596,000.

BACKGROUND

In wireless networks, the ability to correctly receive data packets with increased reliability is important. Typically, if a packet is lost in transmission, the intended recipient requests that the sender retransmit the packet. However, certain systems that utilize a wireless network may require a very low packet loss and retransmission rate, for example where the data being transmitted via the wireless network is critical to the safety or performance of the system. In these systems, packet loss leading to requests for retransmission is unacceptable.

Network coding is a technique that can be used to improve the capacity and efficiency of network transmissions. Network coding functions by transmitting an encoded function of the data bits rather than the original data bits; subsequently, the function of the data bits is decoded to obtain the original data bits. Transmitting functions of the data bits in this manner can reduce the average number of transmissions needed for a given amount of information, which reduces the number of retransmissions needed if there are bit errors or erasures.

Applying a linear network code to a set of packets results in a greater number of packets than originally contained in the set of packets. Although the extra packets that result from the application of the linear network code usually enable the recipient to successfully decode and recover the original packets, certain network codes are still unable to decode the packets even when only a few packets are lost during transmission. When these systems do not receive enough packets to successfully decode the original packets, they must request packet retransmissions, which decreases system performance and reliability. However, if the decoder for the linear network codes is designed to use all the available information at the receiver side of a system, then the number of retransmissions will be reduced, thereby increasing the reliability of the system.

SUMMARY

The problems denoted above are solved in large part by embodiments directed to a method for decoding linear network codes that includes receiving a plurality of packets from an error detector and generating a matrix out of the plurality of packets where elements of each column of the matrix correspond to symbols of the plurality of packets. Then decoding across each row of the matrix using only the symbols with highest associated reliability values to obtain a decoded matrix, where each column of the decoded matrix corresponds to a message packet.

Other embodiments are directed to a system for decoding linear network codes including a linear network decoder and a physical layer. A system for decoding linear network codes includes a packet receiver configured to receive a plurality of packets from an error detector and to receive a plurality of packets from a physical layer. Each packet from the physical layer corresponds to one of the packets from the error detector and each symbol in the packets from the physical layer comprises a reliability value. The system also includes a matrix generator configured to generate a decoding matrix, where elements of each column of the decoding matrix correspond to symbols of one of the plurality of packets. The system includes a decoder configured to decode across each row of the decoding matrix using only the symbols having a highest reliability value to obtain a decoded matrix, where the columns of the decoded matrix correspond to a message packet.

Yet another embodiment is directed to a method for decoding linear network codes that includes receiving a plurality of output packets from an error detector. Each packet comprises symbols with associated reliability values. The method then generates a decoding matrix with elements of each column of the decoding matrix correspond to symbols of one of the plurality of output packets. The method then decodes across each row of the decoding matrix using only the symbols having a highest reliability value, wherein each column of the resulting decoded matrix represents a message packet.

BRIEF DESCRIPTION OF THE DRAWINGS

Figure 2:
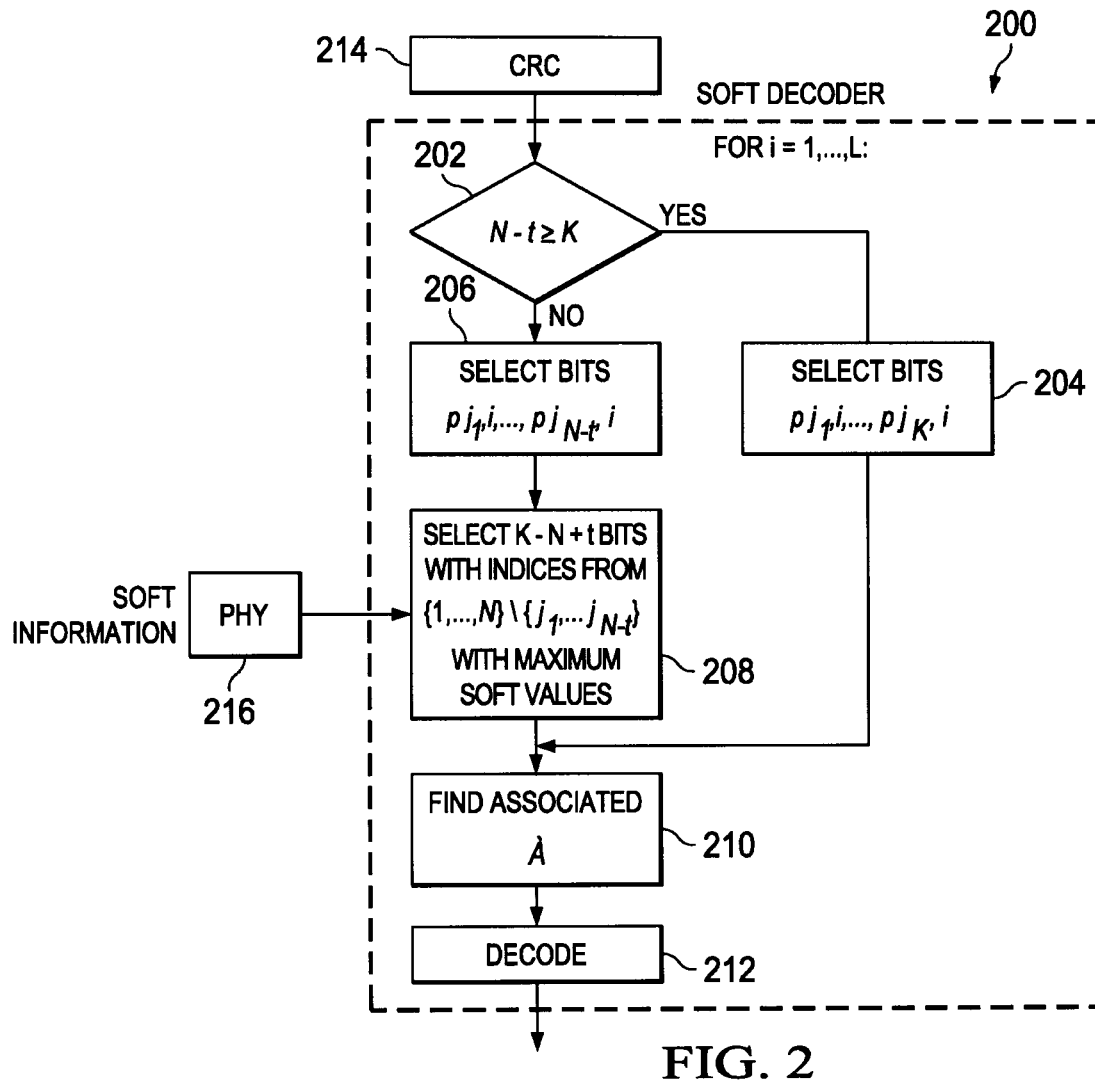

Having thus described the disclosure in general terms, reference will now be made to the accompanying drawings, which are not necessarily drawn to scale, and wherein:

FIG. 1A shows a block diagram of transmitter and receiver using (K, N) linear network code in accordance with various embodiments;

FIG. 1B shows a block diagram of linear network decoder in accordance with various embodiments;

FIG. 2 shows a flow diagram of a linear network decoder in accordance with certain embodiments;

FIG. 3 shows a flow chart of a method for decoding linear network code in accordance with certain embodiments;

FIG. 4 shows a linear network coding system in accordance with various embodiments; and FIG. 5 shows an alternate linear network coding system in accordance with various embodiments.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

As used herein, the term "message packet" refers to packets that contain data to be transmitted from one node to another node in a wireless or wired network.

As used herein, the term "encoded packet" refers to message packets that have been encoded using linear network code.

As used herein, the terms "reliability" or "log-likelihood ratio" refer to a level of confidence designation a receiver-side physical layer (PHY) gives to each symbol of the encoded packets received and denotes the receiver-side PHY's confidence in the correctness of that symbol.

As used herein, the term "received packet" refers to encoded message packets received by a receiver and the received packets may contain bit errors.

As used herein, the term "received encoded packet matrix" refers to a matrix formed of the received encoded packets and these packets may contain errors or erasures.

As used herein, the term "recovered packet" refers to encoded packets successfully received by a decoder without any bit errors and passes a cyclic redundancy checker (CRC), or any other type of error detector, as a result, where each bit or symbol in the recovered packets has an associated high reliability designation from the receiver-side PHY.

As used herein, the term "erasure packets" are placeholder packets for a received packet that has been deemed bad, and thus discarded, due to the receiver-side PHY having no confidence in at least one bit or symbol of the packet.

As used herein, the term "soft information" or "soft data" refers to the information or packets that are the output of the receiver-side PHY. This soft information includes the received packets' bits or symbols augmented with reliability or log-likelihood ratio designations.

As used herein, the term "hard information" or "hard data" refers to recovered bits.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Wireless and wired transmission networks may be designed to utilize linear network codes to help increase system reliability and spectral efficiency. Linear network codes can be used in a variety of systems where reliability and spectral efficiency are of high importance. One example where reliability is of high importance is a wireless point-to-point imaging system used to convey images from reverse-looking cameras on vehicles to the dashboard display used by the vehicle operator. Another example is in military communications where the speed of transmitting an image is crucial for safety. Linear network codes may be advantageous in these types of applications due to their ability to decode packets despite errors during transmission where traditional decoders may request packet retransmissions. Although linear network codes are described in the wireless network setting, such codes may be implemented in many types of networks where reliability and spectral resources are critical.

A linear network code is designed so that the number of packets transmitted is larger than the number of packets being encoded. The network code should also be designed such that the receiver can decode all original message packets from the received encoded packets as long as the number of encoded packets received is greater than some parameter, typically K (K also represents the number of message packets encoded). By preemptively sending a larger number of packets than what is required, network coding can reduce the packet error rate (PER) and correspondingly the retransmission rate while improving the reliability of the network.

The linear network code may be applied either in the network layer or the media access control (MAC) layer. If applied at the network layer, this allows the network code to be added to existing devices that employ wireless communication protocols, such as Wi-Fi or Bluetooth, to increase the underlying system's reliability. Many wireless protocols implement some type of an error-detecting code designed to detect if an encoded packet contains bit errors after the encoded packets are received and decoded at the physical layer (PHY). The error-detecting codes are typically implemented by cyclic redundancy checkers (CRC), but other forms of error detectors may be used. If errors are detected, the entire packet is considered erroneous and is typically discarded, creating a packet erasure. Thus, linear network codes are typically designed to use packets that may contain erasures. However, if too many erasures occur, then retransmissions will likely be requested.

Certain linear network codes can be designed to produce linearly independent combinations of transmitted packets, so that at the receiver, the network code can be inverted even in presence of packet erasures. Assuming enough linearly-independent combinations of the encoded packets are received, all original message packets can be recovered (i.e., decoded). The corollary is that the original message packets may not be recoverable if there are excessive erasures. However, in accordance with various embodiments, soft information is used in addition to the CRC to recover the original K message packets when less than K packets pass CRC. Using soft decoding for linear network codes is less restrictive in terms of what bits or symbols are used for decoding, thus increasing the probability of decoding even in the presence of multiple packet erasures. Hence, a subset of bits or symbols may be selected from each of the encoded packets rather than selecting entire packets for decoding. Including this flexibility in the decoding operation improves the network decoder performance because the decoder is not restricted to only using packets that pass a CRC or other packet error-checking blocks.

A linear network is represented as the application of a linear operator to the original K message packets. The linear operator is typically referred to as the matrix A, which has N columns and K rows, where N is greater than or equal to K.

The message packets to be encoded using the linear network code are arranged into a matrix X of size L×K, where L is the packet length in symbols. Matrix representations of X and A are shown below. The linear operator matrix A is applied to the message packet matrix X to form the encoded matrix Y, where Y=XA.

$$X = \begin{pmatrix} m_{1,1} & m_{1,2} & \cdots & m_{1,K} \\ m_{2,1} & m_{2,2} & \cdots & m_{2,K} \\ \vdots & \vdots & & \\ m_{L,1} & m_{L,2} & \cdots & m_{L,K} \end{pmatrix}$$

$$A = \begin{pmatrix} a_{1,1} & a_{1,2} & \cdots & a_{1,N} \\ a_{2,1} & a_{2,2} & \cdots & a_{2,N} \\ \vdots & \vdots & & \vdots \\ a_{K,1} & a_{K,2} & \cdots & a_{K,N} \end{pmatrix}$$

For linear network codes, A is of size K×N and must be a full rank matrix to ensure that K linear combinations of packets are linearly independent and can therefore be solved for at the receiver. A full rank matrix is defined as a matrix where either all the columns or the rows are linearly independent of one another.

A maximum distance separable (MDS) linear network code is a rate K/N code such that for any subset of the N encoded and transmitted packets having a size greater than or equal to K, the original K packets are recoverable. The disadvantage of using only hard information for decoding MDS linear network codes is that it requires that at least K full encoded packets be received without error. That is, K or more received packets must pass the CRC, meaning the packets contain no bit errors. Additionally, for non-MDS linear network codes, the number of necessary encoded packets passing the CRC needs to be more than K. If less than K received encoded packets pass the CRC, up to all the packets may be unrecoverable, depending on the structure of the linear network code. Hence, packet retransmissions are needed to compensate for this loss.

Requiring packet retransmissions is inefficient, both in terms of spectral efficiency and power usage. In certain cases, despite receiving fewer complete encoded packets than is necessary to successfully decode the original message packets, there may be enough correct information in the received packets to recover all the original message packets because of all the received packets, enough bits or symbols may exist that are non-erroneous. In accordance with various embodiments, linear network codes are decoded using soft information provided by the PHY to recover packets where enough correct information is present but where the packets might be normally unrecoverable.

FIG. 1a shows a system 100 comprising a transmitter 102 and a receiver 104. The transmitter 102 further comprises a network encoder 106, a media access control (MAC) 108 and a PHY 110. The MAC 108 and the PHY 110 coordinate to enable wireless communications (e.g., transmitting and receiving data packets) via a wireless antenna 111. Similarly, the receiver 104 includes at least a PHY 112, a CRC error-detecting block 114, a MAC 116 and a network decoder 118. As above, the MAC 116, the CRC 114 and the PHY 112 coordinate to enable wireless communications via a wireless antenna 113. In some embodiments, the CRC 114 may be replaced or supplemented by a different type of packet error-detecting block. Although the system 100 uses wireless technology to describe how various embodiments of the disclosure, the disclosure may also be utilized in wired systems as well.

In accordance with various embodiments, the network encoder 106 applies a linear network code to a plurality of message packets, for example received from a higher-layer application executing on the transmitter 102, where the message packets are coded both across and within the packets. By performing the linear network coding at the network layer and above the physical layer, the coding may be implemented on existing devices that utilize wireless protocols (e.g., Bluetooth or WiFi) without the need to modify hardware or software used for wireless communications using such protocols.

In accordance with various embodiments, the network decoder 118 can be configured to utilize either soft information, hard information, or both to decode the received packets. The PHY 112 receives received packets, for example that are sent by the transmitter 102 via antenna 111. In addition, PHY 112 evaluates the received packets and assigns confidence values to each symbol in the received packets. Soft information or soft data refers to the PHY 112's assigned confidence characterization along with the symbols of the received packets. The confidence determinations are designated with reliability or log-likelihood ratio values and indicate the level of confidence of the PHY 112 in that symbol being correctly received. The PHY 112 then releases a bit stream for each received packet.

The CRC 114 receives the bit stream from the PHY 112 and uses that bit stream to determine whether there have been any bit errors in the bit stream for a received packet. If the CRC 114 detects bit errors in the bit stream for a received packet, then that entire packet may be discarded and a placeholder, or erasure packet, is put in its place. If the CRC does not detect any bit errors in a the bit stream for a received packet, referred to as passing the CRC 114, then the hard information (recovered packets of bits) or soft information (recovered packets with their log-likelihood ratios or reliability information) is passed up to the higher layers of the receiver 104. However, even though the CRC 114 detects bit errors, those received packets with errors can then be either passed on as an erasure or the soft information can be passed on and used. Lastly, the network decoder 118 may be configured to receive hard information, soft information, or both.

FIG. 1b shows one embodiment of the network decoder 118 in further detail. The network decoder 118 comprises a packet receiver unit 120, a packet replacement unit 122, a received encoded packet matrix generator 124, and a linear network decoder 126. The packet receiver unit 120 receives hard information or hard data from the CRC 114 corresponding to recovered packets (encoded packets without bit errors) and may also receive erasure packets (replacement packets for encoded packets that contained at least one bit error). Packet replacement unit 122 receives soft information or soft data from PHY 112 and replaces any erasure packets with their corresponding soft data, which includes the encoded bits or symbols and their associated reliability values which can be on a continuum from low to high.

Received encoded packet matrix generator 124 forms a received encoded packet matrix using the combination of the hard data and the soft data as columns of the received encoded packet matrix. The received encoded packet matrix may have up to N columns because the linear network codes employed produce N encoded packets. Linear network decoder 126 then performs the decoding step across each row of the received encoded packet matrix using only the K symbols having the highest reliability values, where K denotes the number of message packets that were originally encoded and is also the minimum number of bits or symbols needed to perform a decode. In some embodiments, if at least K packets are recovered, then those K packets will be used to perform the decoding to obtain the original message packets.

In other embodiments, the packet replacement unit 122 may be configured to replace all recovered packets with their soft information before the packets are passed up to the received encoded packet matrix generator 124. An alternative to this embodiment would omit the packet replacement unit 122 and configure the CRC 114 to pass soft data to packet receiver 120. The received encoded packet matrix generator 124 would then form the received encoded packet matrix using only the soft data. Linear network decoder 126 would then decode each row of the matrix using only the K symbols with the highest reliability values.

In other embodiments, encoded packets may be lost during transmission, meaning they would never be received by antenna 113. In this scenario, the CRC 114 may be configured to pass up the soft data received from the PHY 112 but replace any encoded packets lost during transmission with an erasure packet. The MAC 114 would know that there was a missing packet because the network encoder may add a sequence index to each of the N encoded packets transmitted. Then, if a packet is lost at the receiver, a sequence number will be missing. The missing sequence number would signal the CRC 114 to insert an erasure packet. Again, in this embodiment, packet replacement unit 122 would not be bypassed since the CRC 114 would pass along the soft data. The received encoded packet matrix generator 124 would then form the received encoded packet matrix using the soft data and the erasure packet. Linear network decoder 126 would then decode each row of the matrix using only the K symbols with the highest reliability values.

In various embodiments, implementing a linear network code, as described above, is equivalent to applying a linear operator, represented by a matrix A, to a block of message packets that are arranged into a matrix X of size L×K, where L is the length of the K message packets to be encoded. In this embodiment, the linear network code is designed to produce N encoded packets from the K message packets, where N is greater than K. The extra encoded packets are produced so that decoding can be completed even when encoded packets are lost or erased. In order to decode the encoded packets, at least K encoded packets must be received, though not all need to be correctly received. The decoding operation is then performed by applying the inverse of a K×K sub-matrix of the matrix A to the K received encoded packets, where the linear operator A used by the decoder 126 is the same as used by the encoder 106. An inverse of a K×K sub-matrix of the linear operator matrix A is selected by the decoder 126 since only K encoded packets are needed for decoding, not all N encoded packets are necessary. The flexibility gained by only needing to decode a subset of the transmission packets adds to the reliability of the system 100 since fewer retransmissions will be requested by the receiver 104.

In various other embodiments, if there are at least K received packets that pass the CRC 114, meaning that they are recovered, then a subset of size K of these packets is formed by received encoded packet matrix generator 124. The linear network decoder 126 decodes every row of bits or symbols in the received encoded packet matrix obtaining the original encoded message packets. However, if less than K received packets pass the CRC 114, then received encoded packet matrix generator uses the bits or symbols that did pass the CRC 114 and augments them with bits or symbols that correspond to encoded packets that did not pass the CRC 114, but only the bits or symbols with the highest reliability values are selected. In this scenario, the packet replacement unit 122 only selects the number of bits from each row of the matrix necessary so that each row of the matrix contains at least K bits for decoding. For example, if M packets pass CRC, where M is less than K, then K−M bits in each row with the highest reliability values will be selected from packets that did not pass the CRC 114.

In accordance with various embodiments, when soft information is available, the decoding operation may be performed using a combination of hard data and soft data. In this embodiment, rather than consider a whole packet to be an erasure when at least one bit or symbol in the packet is in error, the most reliable bits are selected from each of the received packets and passed to the decoder 118.

FIG. 2 shows a block diagram representing a flow chart of one embodiment of a soft-decoder for linear network codes. Soft decoder 200 comprises decision block 202 where the soft-decoder determines if the number of recovered packets, which is noted as N−t in block 202, is at least equal to K when using a MDS linear network code, where K is the number of encoded message packets. The N in block 202 represents the number of encoded packets and the t represents the number of erasure packets. In other embodiments, a non-MDS linear network code may be implemented, which would require more than K packets be received for decoding. As noted above, at least K packets are needed to decode the encoded packets. If there are enough recovered packets available, meaning N−t≥K, then bit or symbol selection block 204 selects at least K bits or symbols, denoted by the $p_{j,i}$ notation, with the highest reliability values from each row of the received encoded packet matrix, wherein the K symbols selected all have high reliability values assigned since they are from recovered packets due to passing CRC 214.

Additionally, since block 202 determined that there are enough recovered packets to perform the decode operation, then the K bits or symbols selected can come from the same column position for each row. The K symbols selected are then passed on to linear operator matrix block 210 where an inverted sub-matrix of the linear operator matrix A is found for decoding the received encoded packet matrix formed by block 204. The selection of the inverted sub-matrix of the linear operator matrix follows the steps described above. The decoder then applies the inverted sub-matrix of the linear operator matrix to the K bits selected from each row to obtain a decoded matrix of size L×K, where the columns of the matrix correspond to the original K message packets. This embodiment applies the same inverted sub-matrix of the linear operator matrix to each row of the received encoded packet matrix since there were at least K recovered packets.

However, if at decision block 202 it is determined that there are not enough recovered packets available to decode, meaning not enough hard data, then bit selection block 206 selects all the symbols from the recovered packets and combines them with soft data from the PHY 216. The notation used in block 206, $p_{j,i}$, denotes the selection of all the bits or symbols from the recovered packets. Soft information selection block 208 then selects the soft data from the PHY 216, but only those symbols with the highest reliability values, corresponding to packets that did not pass the CRC 214. This soft data, as previously described, contains the bits or symbols received plus their associated reliability values.

Once the hard data and the soft data is selected, soft information selection block 208 also forms a received encoded packet matrix of size L×K using the combination of the symbols selected. The linear operator matrix block 210 uses the received received encoded packet matrix as reference to form the inverted sub-matrix of linear operator matrix A. Here, however, each row of the received encoded packet matrix may have a different set of symbols with the highest reliability values, meaning they may fall in different column positions, which implies that each row may have a different inverted sub-matrix of linear operator matrix A. Thus, up to L different inverted sub-matrices of linear operator matrix A may be required to decode the entire received encoded packet matrix.

For example, consider the following matrix, $\hat{Y}$, which is the matrix of linear network coded message packets formed by the operation Y=XA, as shown above, with "^" denoting the presence of some errors.

$$\hat{Y} = \begin{pmatrix} y_{1,1} & y_{2,1} & \cdots & y_{K,1} & y_{K+1,1} & \hat{y}_{K+2,1} & \cdots & y_{N,1} \\ y_{1,2} & y_{2,2} & \cdots & y_{K,2} & \hat{y}_{K+1,2} & y_{K+2,2} & \cdots & y_{N,2} \\ \vdots & \vdots & & \vdots & \vdots & & & \vdots \\ \hat{y}_{1,L} & y_{2,L} & \cdots & y_{K,L} & y_{K+1,L} & y_{K+2,L} & \cdots & \hat{y}_{N,L} \end{pmatrix}$$

There are errors in the following positions: (1,L), (K+1,2), (K+2,1) and (N,L). The first value in the position coordinates indicates the recovered packet, or column, that the erroneous symbol belongs to and the second value in the position coordinates indicates the symbol location within the packet, or row, that is erroneous. Therefore, packets 1, K+1, K+2 and N all fail CRC 214, meaning there are four packet erasures, since they contain at least one symbol error, and a total of N−4 recovered packets pass CRC 214, based on N transmission packets.

Thus, if the number of recovered packets is at least K, where K represents the number of message packets encoded, then K symbols in each row are selected from the packets that pass the CRC 214. For example, from the first row the following symbols could be selected for decoding:

$(y_{2,1}, y_{3,1}, \ldots, y_{K,1}, y_{K+3,1})$.

However, those same symbol locations do not necessarily need to be chosen for decoding the second row. In the case that the number of packets that pass CRC is at least K, the bits selected in each row for decoding may be in the same locations. Hence, for each row i we select the bits $(y_{4,i}, y_{6,i}, \ldots, y_{K-1,i}, y_{K+8,i})$.

However, there is no restriction to using bits in the same locations for decoding each row.

If the number of encoded packets that pass the CRC 214 is less than K, then all symbols from the those packets are selected and padded with a number of symbols with the highest reliability values from the received packets that did not pass the CRC 114. The number of pad symbols selected will at least equal the difference between the required K bits and the number of recovered packets. For row one, since packets 1, K+1, K+2 and N fail the CRC 214, the bits or symbols first selected from each row will all come from recovered packets. Then, additional pad bits or symbols are selected from the soft data.

In other words, the number of pad bits or symbols selected is equal to the difference between K and the number of recovered packets. Additionally, the pad bit selection process is governed by the magnitude of the associated reliability value. Since the bit $y_{K+2,1}$ is incorrect, it has a small reliability value and will likely not be selected. The same process is repeated for the rows 2 through L.

FIG. 3 shows a method 300 for decoding linear network codes using soft data in accordance with various embodiments. The method 300 begins at step 302 with receiving a plurality of encoded packets from an error. The method 300 continues at step 304 with generating a matrix wherein elements of each column of the matrix correspond to symbols of the plurality of packets. The method 300 continues at step 306 with decoding across each row of the matrix using only the symbols with highest associated reliability values to obtain a decoded matrix, wherein each column of the decoded matrix corresponds to a message packet. First, step 306 uses the matrix indeces of the symbols with the highest reliability values to select the inverted sub-matrix of the linear operator matrix A. Second, step 306 applies the inverted sub-matrix to the subset of the received encoded packet matrix that comprises the symbols having associated high reliability values. As a result of performing the decoding, step 306 also obtains a decoded matrix wherein each column of the decoded matrix corresponds to a message packet.

Some embodiments of the above method 300 may apply a different inverted sub-matrix of linear operator matrix A to each row of the received encoded packet matrix based on which bits or symbols in the rows of the received encoded packet matrix have high reliability values.

Some embodiments of the above method 300 may use only the soft information for decoding the symbols of the packets. This is similar to step 308 generating a matrix with encoded packets directly taken from a PHY layer, like PHY 112 in FIG. 1A, then performing the decoding on each row of the matrix using K symbols with the highest reliability values.

Other embodiments of the above method 300 may be extended to decoding linear network codes that have a further constraint requiring that the bits or symbols selected must also be formed of linearly independent combinations of the original message packets.

Other embodiments of the above method 300 may use near-MDS linear network codes or random linear network codes. In these cases, K bits from each row should be selected such that they are K linearly independent combinations of the original bits and are the most reliable bits or symbols.

FIG. 4 shows a network coding system 400 in accordance with various embodiments. The network coding system 400 includes a packet encoding engine 402 and a packet decoding engine 404. In addition, a packet repository 406 may be coupled to the engines 402, 404. The packet encoding engine 402 and the packet decoding engine 404 are combinations of programming and hardware to execute the programming. Although shown separately, the packet encoding engine 402 and the packet decoding engine 404 are not required to represent separate pieces of software programming. For example, each engine 402, 404 may share a common processor and memory, although this is not required. Additionally, the programming that enables the functionality of each engine 402, 404 may be included in the same executable file or library.

The packet encoding engine 402 receives message packets that contain data to be transmitted from, for example, a higher-layer application executing on the transmitter 102. The message packets may be received from the packet repository 406. The packet encoding engine 402 also encodes the message packets to produce a number of transmission packets greater than the number of message packets. In accordance with various embodiments, the packet encoding engine 402 encodes the message packets by applying a linear network code, MDS network code as one example, to corresponding symbols of the message packets to produce a corresponding symbol in the transmission packets. The packet encoding engine 402 performs the encoding process as is described above with respect to FIG. 1a.

The packet decoding engine 404 receives a number of recovered packets. The packet decoding engine 404 may also receive an erasure packet or erasure signal (e.g., from a CRC 114) that indicates one or more transmission packets were not received successfully. The recovered packets and/or the erasure packets may be at least temporarily stored at the packet repository 406. Similar to above, the packet decoding engine 404 selects a number of recovered packets equal to the number of original message packets (i.e., K received packets) to form columns of a received encoded packet matrix. The packet decoding engine 404 generates an inverted sub-matrix of linear operator matrix A that have indices that correspond to the selected recovered packets. In some embodiments, the received encoded packet matrix can be made of a mixture of recovered packets and soft data as described above and the inverted subset of matrix A will have indices that correspond to the K highest reliability bits in each row of the received encoded packet matrix. Finally, the packet decoding engine 404 multiplies the received encoded packet matrix by the subset of the inverted matrix A to generate a decoded matrix where each column corresponds to a message packet. This is similar to the decoding process as described above with respect to FIGS. 1a, 1b and 2.

FIG. 5 shows another example of a network coding system 500 in accordance with various embodiments. The network coding system 500 includes a memory resource 504 coupled to a processing resource 502. The processing resource 502 is one or more local or distributed processors. The memory resource 504 includes one or more local or distributed memory devices and comprises a packet encoding module 506 and a packet decoding module 508. Thus, the memory resource 504 and the processing resource 502 are hardware components of the system 500.

Each module 506, 508 represents instructions that, when executed by the processing resource 502, implement an associated engine. For example, when the packet encoding module 506 is executed by the processing resource 502, the above-described packet encoding engine 402 functionality is implemented. Similarly, when the packet decoding module 508 is executed by the processing resource 502, the above-described packet decoding engine 404 functionality is implemented. The modules 506, 508 may also be implemented as an installation package or packages stored on the memory resource 504, which may be a CD/DVD or a server from which the installation package may be downloaded. Additionally, in some embodiments, the above-described functionality may be implemented in an application-specific integrated circuit (ASIC), a combination of an ASIC and software, or an application-specific instruction-set processor (ASIP). The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for decoding linear network codes, comprising:
    receiving, by a processor, a plurality of packets from an error detector;
    generating, by the processor, a matrix wherein elements of each column of the matrix correspond to symbols of the plurality of packets; and
    decoding, by the processor using both soft information and a plurality of results from said error detector, across each row of the matrix using only the symbols with highest associated reliability values to obtain a decoded matrix, wherein each column of the decoded matrix corresponds to a message packet.

2. The method of claim 1 further comprising:
    receiving, by a processor, a plurality of packets from an error detector, wherein the plurality of packets comprises recovered packets and at least one erasure packet, wherein all symbols in recovered packets have high associated reliability values;
    selecting, by the processor, a replacement packet from a physical layer that corresponds to the erasure packet, wherein each symbol in the replacement packet comprises a reliability value; and
    replacing, by the processor, the at least one erasure packet with the replacement packet.

3. The method of claim 1 further comprising:
    selecting, by the processor, a replacement packet from a physical layer that corresponds to each of the plurality of packets from the error detector, wherein each symbol in the replacement packet comprises a reliability value; and
    replacing, by the processor, the plurality of packets with the replacement packets.

4. The method of claim 1 wherein the number of symbols selected from each row to perform the decoding is at least equal to a number of message packets originally encoded.

5. The method of claim 1 wherein the symbols selected from each row to perform the decoding are taken from a linearly independent set of columns, wherein the number of columns decoded is at least equal to the number of message packets originally encoded.

6. The method of claim 1 wherein the reliability values comprise a characterization made by the physical layer that represents a level of confidence in each symbol being received without error, and the associated reliability value is a continuum of values ranging from low to high.

7. The method of claim 1 further comprising:
    decoding, by the processor using both soft information and a plurality of results from said error detector, across each row of the matrix using an inverted subs-matrix of a linear operator matrix;
    wherein the inverted sub-matrix of the linear operator matrix is determined by the symbols having associated high reliability values; and
    wherein the subset of the invertible linear operator matrix is only applied to the symbols of the matrix having associated high reliability values.

8. A system for decoding linear network codes, comprising:
    a packet receiver configured to:
        receive a plurality of packets from an error detector including soft information and a plurality of results from said error detector; and
        receive a plurality of packets from a physical layer, wherein each packet from the physical layer corresponds to one of the packets from the error detector and each symbol in the packets from the physical layer comprises a reliability value;
    a matrix generator configured to generate a decoding matrix, wherein elements of each column of the decoding matrix correspond to symbols of one of the plurality of packets; and
    a decoder configured to decode across each row of the decoding matrix using only the symbols having a highest reliability value to obtain a decoded matrix, wherein all bits in recovered packets have high reliability values, wherein the columns of the decoded matrix correspond to a message packet.

9. The system of claim 8 further comprising:
    a packet replacement unit configured to replace an erasure packet with its corresponding packet from the physical layer, wherein the plurality of packets received from the error detector comprise recovered packets and at least one erasure packet.

10. The system of claim 8 wherein the packet replacement unit is further configured to replace the plurality of packets with their corresponding packets from the physical layer.

11. The system of claim 8 wherein the reliability values comprise a characterization made by the physical layer that represents a level of confidence of the physical layer in each symbol being received without error, and the reliability value is a continuum of values ranging from low to high.

12. The system of claim 8 wherein the decoder is further configured to select for decoding a number of symbols from each row at least equal to a number of message packets originally encoded.

13. The system of claim 8 wherein the decoder is further configured to select for decoding symbols from each row from a linearly independent set of columns, wherein the number of columns selected is at least equal to the number of message packets originally encoded.

14. A method for decoding linear network codes, comprising:
- receiving, by a processor, a plurality of output packets from an error detector, wherein each packet comprises symbols with associated reliability values;
- generating, by the processor, a decoding matrix, wherein elements of each column of the decoding matrix correspond to symbols of one of the plurality of output packets; and
- decoding, by the processor using both soft information and a plurality of results from said error detector, across each row of the decoding matrix, using only the symbols having a highest reliability value, wherein each column of the resulting decoded matrix represents a message packet.

15. The method of claim 14 further comprising:
- wherein the plurality of output packets comprises of recovered packets and at least one erasure packet, wherein all symbols in the recovered packets have high reliability values;
- selecting, by the processor, a packet from a physical layer that corresponds to the at least one erasure packet, wherein each symbol in the packet from the physical layer comprises an associated reliability value ranging from low to high; and
- replacing, by the processor, the erasure packet with the packet from the physical layer.

16. The method of claim 15 further comprising:
- replacing, by the processor, the plurality of output packets with their corresponding packets from the physical layer.

17. The method of claim 15 wherein at least one of the plurality of output packets is not recovered by the physical layer and the error checker replaces it with an erasure packet.

18. The method of claim 14 wherein the reliability values correspond to a characterization made by the physical layer that denotes the physical layer's level of confidence in each symbol being received without error, and the associated reliability value is a continuum of values ranging from low to high.

19. The method of claim 14 wherein the number of symbols selected to perform the decoding is at least equal to a number of message packets originally encoded.

20. The method of claim 14 wherein the symbols selected to perform the decoding are taken from a linearly independent set of columns, wherein the number of columns decoded is at least equal to the number of message packets originally encoded.

* * * * *